United States Patent [19]

Pashley

[11] 4,033,026

[45] July 5, 1977

[54] HIGH DENSITY/HIGH SPEED MOS PROCESS AND DEVICE

[75] Inventor: Richard D. Pashley, Mountain View, Calif.

[73] Assignee: Intel Corporation, Santa Clara, Calif.

[22] Filed: Dec. 16, 1975

[21] Appl. No.: 641,259

[52] U.S. Cl. .............................. 29/571; 29/577; 29/578; 357/41; 357/46
[51] Int. Cl.² .......................................... B01J 17/00
[58] Field of Search ............... 29/571, 577, 578; 357/41, 42, 46

[56] References Cited

UNITED STATES PATENTS

| 3,646,665 | 3/1972 | Kim | 357/42 |
| 3,660,735 | 5/1972 | McDougall | 357/42 |
| 3,752,711 | 8/1973 | Kooi | 29/571 |

*Primary Examiner*—W. Tupman
*Attorney, Agent, or Firm*—Blakely, Sokoloff, Taylor & Zafman

[57] ABSTRACT

A process for fabricating MOS silicon gate transistors which provide high density and high speed devices. The process includes the use of a boron ion implantation step to prevent punch-through and to adjust the thresholds of enhancement mode transistors. Both enhancement mode and depletion mode transistors are simultaneously produced with the disclosed process.

9 Claims, 11 Drawing Figures

HIGH DENSITY/HIGH SPEED MOS PROCESS AND DEVICE

BACKGROUND OF THE INVENTION

1. Field of the Invention

The invention relates to the processing and fabrication of MOS silicon gate, field-effect transistors and related devices.

2. Prior Art

Numerous processes are known for the fabrication of silicon gate, metal-oxide-semiconductor (MOS) transistors. This known technology permits high production fabrication of enhancement mode and depletion mode, n-channel and p-channel devices. For a general discussion of known technology, see: *IEEE Spectrum*, "Silicon Gate Technology" by Moore, Vadasz, Grove and Rowe, October 1969 beginning on page 28; and *Physics & Technology of Semiconductor Devices* by Andrew S. Grove, published by Wiley.

With current production processes, by way of example, an n-channel, two transistor inverter may be fabricated on approximately 2 mils$^2$ of substrate. With the invented process, this area may be reduced by approximately 50 percent. This reduction in area permits fabrication of higher density devices. Moreover, with the disclosed process, by way of example, the operational speed for an n-channel MOS transistor is improved by approximately 600 percent over prior art, production transistors.

SUMMARY OF THE INVENTION

A process for fabricating an enhancement mode transistor and a depletion mode transistor on a p-type silicon substrate including the formation of a buried contact is described. A first region of the substrate is doped with an n-type dopant to adjust the threshold voltage of the depletion mode transistor. Next, a gate oxide layer is formed on the substrate, this layer covers at least a portion of the first region. The upper surface of the substrate is then doped with a p-type threshold adjusting dopant to adjust the threshold voltage of the enhancement mode transistor. Following this a window is formed through this gate oxide layer to expose a portion of the substrate adjacent to the first region. Next, gates are formed on the gate oxide layer including the doping of these gates and the formation of an n-type region at the window to form the buried contact. Source and drain regions are formed in alignment with these gates.

DETAILED DESCRIPTION OF THE INVENTION

An MOS silicon gate process is described which may be used for the fabrication of high density and high speed enhancement and depletion mode devices. The invented process shall be described in conjunction with the fabrication of an inverter which includes an n-channel depletion mode transistor and an n-channel enhancement mode transistor. Some of the details described below are required for the fabrication of the inverter, and hence may not be required for the fabrication of other MOS devices. It will be understood by one skilled in the art, however, that the described process may be readily employed for fabricating other MOS integrated circuits with obvious deviations from the following description.

Figure 1:
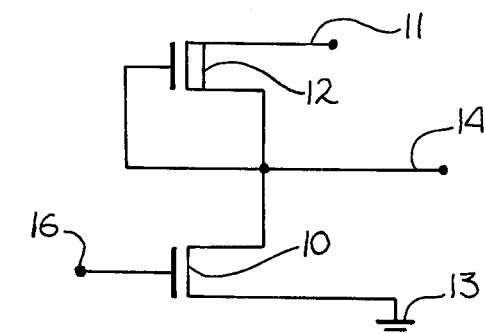
FIG. 1 is a schematic of an inverter which includes an enhancement mode transistor and a depletion mode transistor.

Referring first to FIG. 1, the process shall be described, as mentioned, for the formation of an inverter which includes a depletion mode transistor 12 coupled in series with an enhancement mode transistor 10. The drain region of the transistor 12 is coupled to a terminal 11; the source region of transistor 12 and the drain region of transistor 10 are coupled to a commom output terminal 14. The source region of transistor 10 is coupled to terminal 13; the gate of transistor 10 which is the input to the inverter, is coupled to a terminal 16. The inverter circuit of FIG. 1 operates in a well known manner using the combination of an enhancement mode (input) transistor and a depletion load transistor. Thus, in operation the contact 11 is normally coupled to a positive potential with respect to the contact 13.

Figure 2:
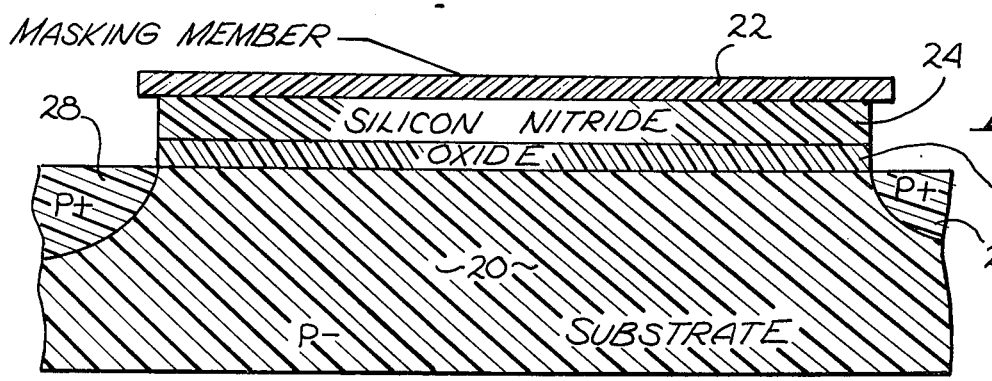
FIG. 2 is a cross-sectional elevation view of a silicon substrate which includes an oxide layer, silicon nitride layer, masking member, and field-stop regions.
Figure 3:
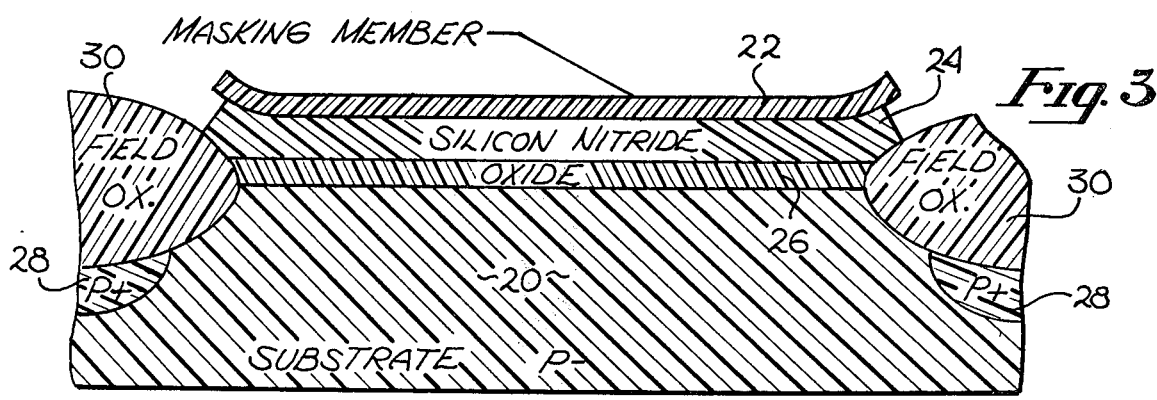
FIG. 3 illustrates the substrate of FIG. 2 with a field oxide layer deployed on portions of the upper surface of the substrate.
Figure 11:
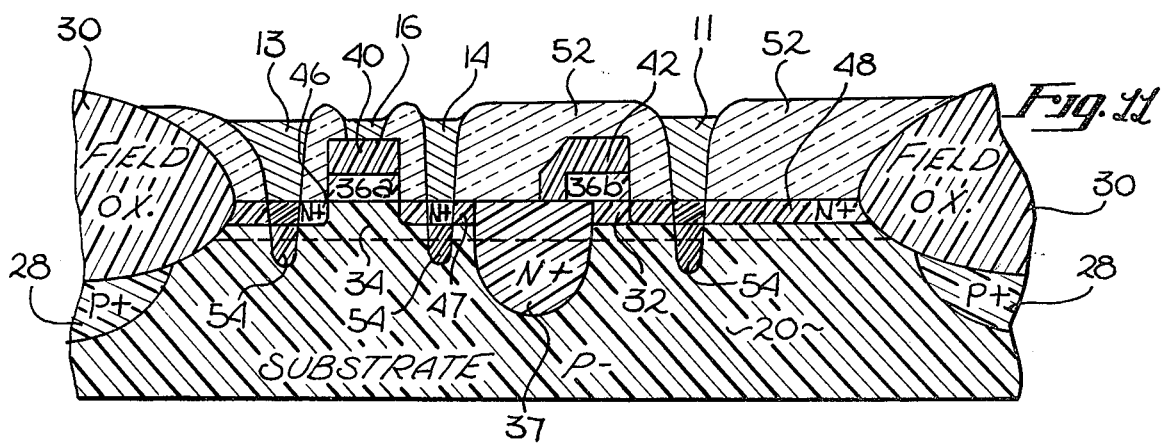
FIG. 11 illustrates the substrate of FIG. 10 with a protective layer deployed over the substrate and with metal contacts.

For the described process, FIGS. 2 and 3 are used to illustrate the manner in which the upper surface of the substrate is prepared prior to the fabrication of field-effect transistors 10 and 11 of FIG. 1. Other known methods of deploying field-stop regions and field oxides thus may be employed in lieu of the process described in conjunction with these figures. FIG. 11 is used to describe the completed inverter, and in particular the protective coating disposed over the transistors and the metal contacts used for terminals 11, 13, 14 and 16 described in conjunction with FIG. 1. It will be apparent that other known processes may be employed for completing the inverter in lieu of those described in conjunction with FIG. 11.

Referring first to FIG. 2, a p-type silicon substrate 20 is employed in the presently preferred embodiment. The substrate is doped to a level of approximately 50 ohm-cm. A silicon oxide (i.e. SiO$_2$, SiO) layer 26 is formed on the upper surface of the substrate 20 by known techniques; for example, the oxide may be thermally grown on the substrate 20. Next a silicon nitride (Si$_3$N$_4$) layer 24 is formed on the upper surface of the oxide layer 26 by known processes. A masking member 22 is then fabricated on the upper surface of the silicon nitride layer 24. This masking member is used to define areas of the substrate where devices are to be fabricated. For this example, only a single area of the substrate is shown defined by the masking member 22. However, it will be appreciated that other areas of the substrate may be simultaneously processed and other devices fabricated along with the fabrication of the described inverter.

Masking member 22 is employed to etch the silicon nitride layer 24 and the oxide layer 26 to form the structure illustrated in FIG. 2. Known etchants such as hydrofluoric acid and hot phosphoric acid may be used for this etching. By way of example, the oxide layer 26 may be between 200 and 400 A thick and the silicon nitride layer 24 may be between 1,000 and 3,000 A thick. Field stop regions 28 are then formed by placing impurities into the substrate in alignment with the edges of the layers 24 and 26. The field-stop regions 28 may be formed by boron ion implantation at 25 KeV to obtain an impurity level of $3\times10^{13}$/cm$^2$.

A relatively thick (e.g. 10,000 A) a field oxide 30 (FIG. 3) is now formed on the upper surface of the substrate over those areas of the substrate which are not covered by the silicon nitride layer 24. The silicon nitride layer 24 protects the surface of the substrate during the fabrication of the field oxide 30, as is known in the art.

Figure 4:
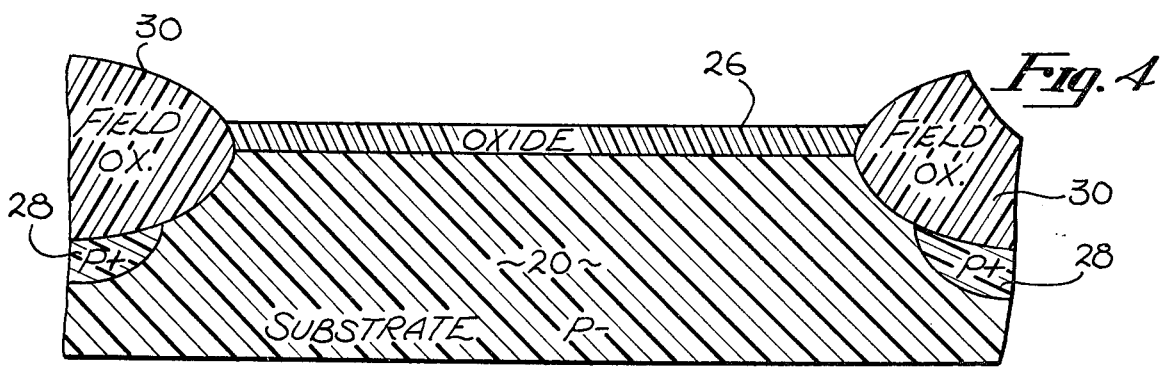
FIG. 4 illustrates of FIG. 3 with the masking member and silicon nitride layer removed.
Figure 5:
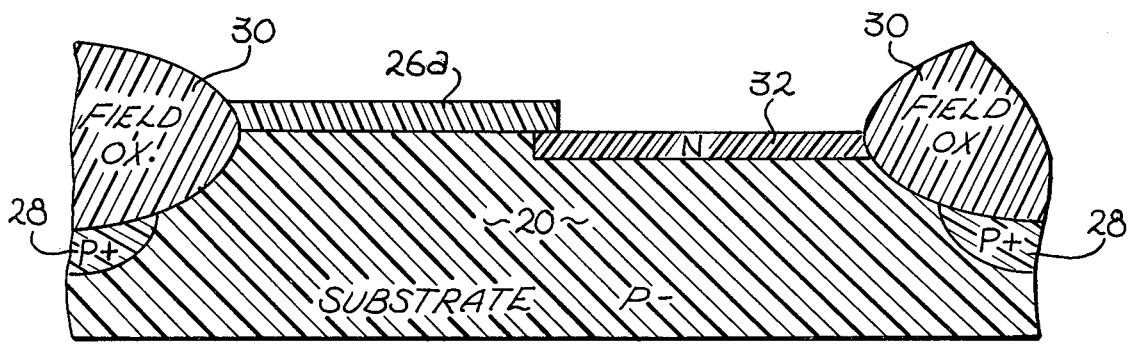
FIG. 5 illustrates the substrate of FIG. 4 with the oxide layer etched and with an n-type region formed in the substrate.

As shown in FIG. 4, the masking member 22 and silicon nitride layer 24 are now removed with known etchants. Through use of known photolithographic masking and etching steps, part of the oxide layer 26 is removed leaving a portion of that layer, shown in FIG. 5 as layer 26a. The exposed region of the substrate is then ion implanted with n-type impurities such as arsenic to form the n-type region 32. By way of example, this ion implantation may be performed at 25 KeV to an impurity level of approximately $2.1\times10^{12}$/cm$^2$. This ion implantation step is used to establish the threshold level for the depletion mode transistor.

Figure 6:
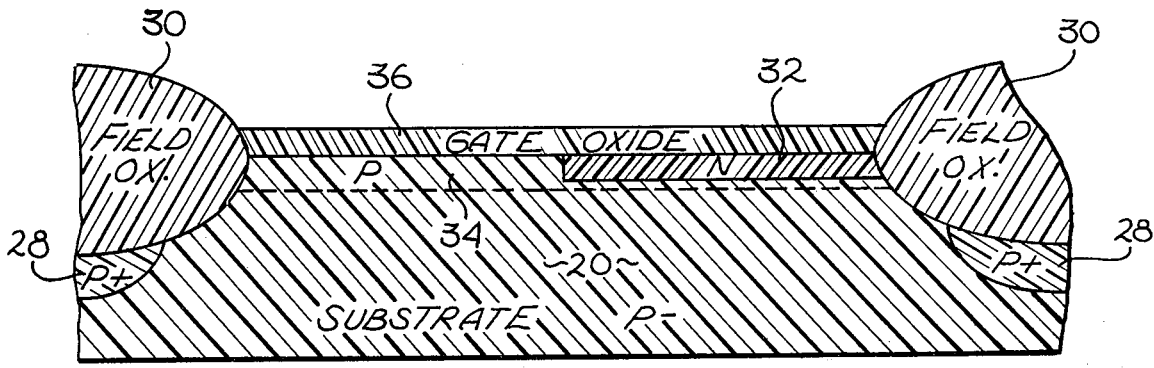
FIG. 6 illustrates the substrate of FIG. 5 with a gate oxide layer deployed on the surface of the substrate and with a p-type ion implanted region formed in the upper surface of the substrate.

The remaining portion of the oxide layer 26a can now be removed employing a known etchant such as hydrofluoric acid. A gate oxide layer 36 shown in FIG. 6 is then fabricated on the upper surface of the substrate employing known techniques, for example, a thermally grown oxide may be employed. In the presently preferred embodiment this gate oxide layer is 500 ± 50 A thick. As shown in FIG. 6, region 32 does not substantially increase in size during the formation of the gate oxide layer 36 because of the slow diffusing characteristics of the arsenic dopant. The substrate is next subjected to a boron ion implantation to implant the upper surface of the substrate to form the p-type region 34. This ion implantation is performed through the oxide layer 36. In FIGS. 6 through 11 the boundary of region 34 is shown by a broken line. By way of example, this ion implantation may be performed with boron (B$_{11}$) at 50 KeV to a level of $7\times10^{11}$/cm$^2$. P-type region 34 is generally employed to adjust the threshold of the enhancement mode transistor and also to assist in preventing punch-through. However, since only the upper surface is implanted, the completed circuit has a low body effect. Therefore when back bias is employed only a small shift in threshold results when compared to prior art devices.

Figure 7:
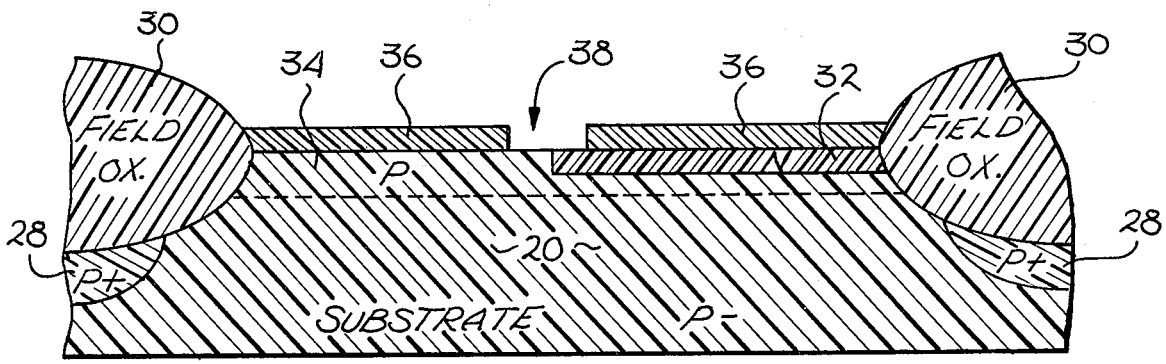
FIG. 7 illustrates the substrate of FIG. 6 with a window formed through the gate oxide layer.

Referring now to FIG. 7, a window 38 is formed within the oxide layer 36 by known photolithographic techniques; window 38 intersects the n-type region 32 at the surface of the substrate. This window is used for the buried contact between the gate and source region of depletion mode transistor 12 of FIG. 1 and the drain region of transistor 10.

Figure 8:
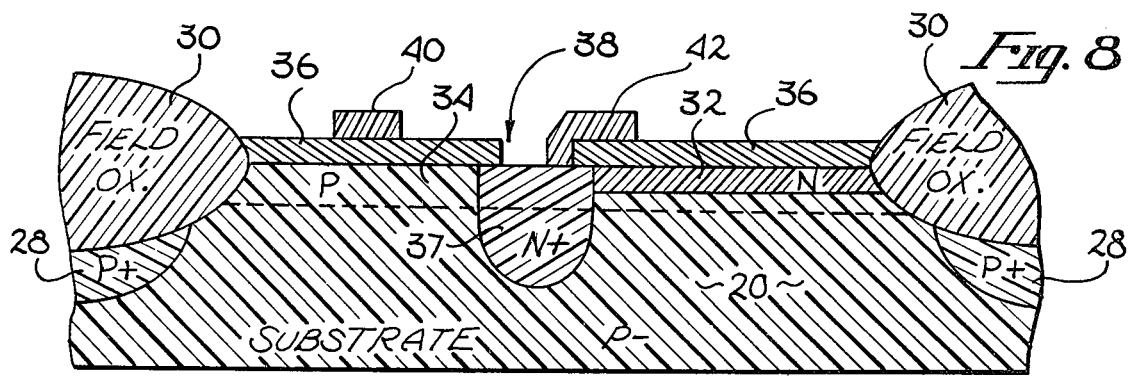
FIG. 8 illustrates the substrate of FIG. 7 with two gate structures formed on the gate oxide layer and with a diffused n-type region formed in the substrate through the window.

Referring to FIG. 8, the silicon gate 40 for transistor 10 of FIG. 1 and the silicon gate 42 for transistor 12 of FIG. 1 can now be formed on the gate oxide layer 36. Note that the gate 42 extends into the window 38 and is in contact with the surface of the substrate. Gate 40 is approximately 2 microns (±0.5 microns) wide and the gate 42 is approximately 10 microns wide in the presently preferred embodiment. These gates may be formed by several known techniques. In the presently preferred embodiment, the process employed for forming the gate 40 is described in detail in copending application entitled "Process For Fabricating Narrow Polycrystalline Silicon Structures", Ser. No. 626,855, filed Oct. 29, 1975 and assigned to the assignee of this application. In this process a narrow gap or line is delineated from the edge of a masking member on a polycrystalline silicon layer. Regions of this polycrystalline silicon layer are then doped through the narrow gap or line with boron to form doped p-type regions in the silicon layer which are surrounded by undoped polycrystalline silicon regions. These doped regions are larger in width than the gap or line, and the diffusion of boron from the narrow gap or line is used to control the dimensions of the doped regions. The silicon layer is then subjected to an etchant which discriminates between undoped and doped polycrystalline silicon; in this manner the undoped silicon is etched, defining the gate structures. The boron dopant employed in this process results in p-type gate structures 40 and 42.

Finally, the substrate is subjected to a standard phosphorus predeposition step by heating the wafer in the presence of a phosphorus-containing gas to change the conductivity types of these gates to n-type. During this diffusion step, the heavily doped n-type region 37 shown in FIG. 8 (N+) is formed through the window 38.

For the described embodiment gate 42 has a width of approximately 10 microns. In other circuits where buried contacts are employed it may be necessary to have narrower gates. In such a case the gate 42 may be fabricated with a "U" or "L" shape such that the region 37 and the contact portion of the gate are not adjacent to the channel of the transistor. In this manner, the buried contact may be off to the side of the active region of the transistor.

Figure 9:
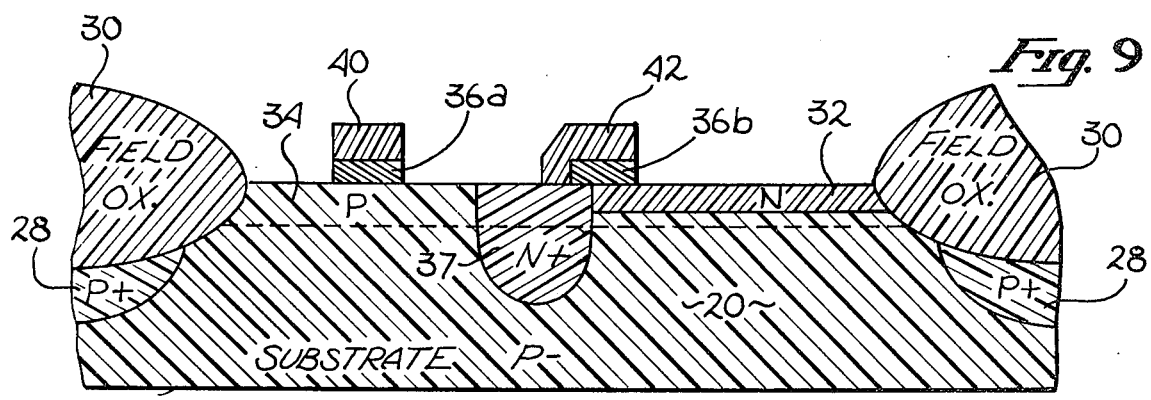
FIG. 9 illustrates the substrate of FIG. 8 with an etched gate oxide layer.

As shown in FIG. 9, after the gates have been fabricated, the gate oxide layer 36 is etched to form a gate oxide 36a for the gate 40, and gate oxide 36b for the gate 42. This etching may be performed in a known manner.

Figure 10:
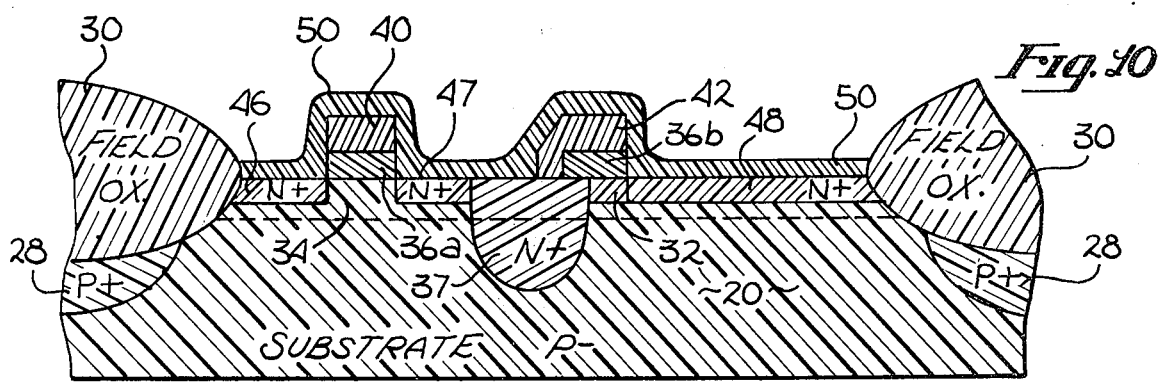
FIG. 10 illustrates the substrate of FIG. 9 with source and drain regions formed in alignment with the gates of FIG. 9 and with an oxide layer formed over the substrate surface.

The spaced-apart source and drain regions for transistor 10 of FIG. 1 and the drain region for transistor 12 are now formed within the substrate as shown in FIG. 10. The source region 46 and drain region 47 for transistor 10(adjacent to the gate 40) and the drain region 48 for transistor 12(adjacent to gate 42) are simultaneously formed. These regions are formed in alignment with the gates using a standard predeposition type diffusion of n-type impurities. No further masking is required for this step. In the presently preferred embodiment, arsenic is employed. Preferably a drive-in step is also used after predeposition to further define these regions. Silicon oxide layer 50 is formed during the drive step as shown in FIG. 10. By way of example, regions 46, 47 and 48 extend into the substrate approximately 0.5 microns. Note that a portion of n-type region 32 discussed above in conjunction with FIG. 5 remains beneath the gate 42 to provide the threshold adjustment for the depletion mode transistor 12 of FIG. 1.

Next, as shown in FIG. 11, a standard protective coating 52, which may be glass or other known protective coating, is disposed on the substrate over the transistors. Through use of standard photolithographic techniques, metal contacts, such as aluminum, are formed through the protective glass coating 52 and in contact with the underlying regions. Specifically, terminal 13 provides contact to region 46; terminal 16 to gate 40; terminal 14 to region 47; and terminal 11 to drain region 48 of transistor 11. The contact between the gate of transistor 12, the source of transistor 12 and the drain of transistor 10 is a buried contact. This buried contact includes the portion of gate 42 which contacts region 37 and the intersection of regions 37 and 47. Also as shown in FIG. 11, n-type regions 54 are disposed beneath the contacts in the substrate. These phosphorus-doped regions, as is known in the art, are used to prevent junction spiking.

The inverter shown in FIG. 11 operates in a standard manner for an inverter which includes a depletion load, however, the substrate area required for the inverter is less than that of prior art inverters; moreover, the speed of the inverter is substantially improved over prior art n-channel MOS inverters.

Thus, an MOS silicon gate process has been disclosed which permits the fabrication of enhancement mode and depletion mode field-effect transistors on a silicon substrate. The process permits fabrication of higher density/higher speed devices when compared to prior art high production processes.

I claim:

1. A process for fabricating an enhancement mode transistor and a depletion mode transistor on a p-type silicon substrate which includes the fabrication of a buried contact comprising the steps of:
   doping a first region of said substrate with an n-type dopant to adjust the threshold of said depletion mode transistor;
   forming a gate oxide layer on said substrate, said gate oxide layer covering at least a portion of said first region;
   doping the upper surface of said substrate with a p-type threshold adjusting dopant to adjust the threshold of said enhancement mode transistor;
   defining a window through said gate oxide layer to expose a portion of said substrate adjacent to said first region;
   forming a first and second polycrystalline silicon gate on said gate oxide layer, said first gate spaced apart from said first region, said second gate formed on said oxide layer such that at least a portion of said first region is disposed beneath said second gate with said second gate extending into said window and contacting said substrate, including the doping of said gates with an n-type dopant and the formation of an n-type second region at said window, said second region contacting said first region;
   forming a first source region and a first drain region in alignment with said first gate, said first source region contacting said second region, and forming at least a second drain region in alignment with said second gate spaced apart from said second region;
   whereby an enhancement mode and a depletion mode transistor are fabricated with a buried contact which couples said gate and source region of said depletion mode transistor with said drain region of said enhancement mode transistor.

2. The process defined by claim 1 wherein said doping of said upper surface of said substrate with said p-type dopant includes the step of ion implanting said p-type dopant through said gate oxide layer.

3. A process for fabricating an enhancement mode transistor and depletion mode transistor on a p-type silicon substrate which includes the fabrication of a buried contact comprising the steps of:
   doping a first region of said substrate with an n-type dopant to adjust the threshold of said depletion mode transistor;
   forming a gate oxide layer on said substrate, said gate oxide layer covering at least a portion of said first region;
   ion implanting the upper surface of said substrate with a p-type threshold adjusting dopant to adjust the threshold of said enhancement mode transistor;
   defining a window through said gate oxide layer to expose a portion of said substrate adjacent to said first region;
   forming a first and a second polycrystalline silicon gate on said gate oxide layer, said first gate being spaced apart from said first region and said second gate being formed on said oxide layer such that at least a portion of said first region is disposed beneath said second gate with said second gate extending into said window and contacting said substrate;
   doping a second region with an n-type dopant in said substrate through said window, said second region contacting said first region;
   forming a first source region and a first drain region in alignment with said first gate, said first source region contacting said second region, and forming at least a second drain region in alignment with said second gate spaced apart from said second region;
   whereby an enhancement mode and depletion mode transistor are fabricated with a buried contact which couples said gate and source region of said depletion mode transistor with said drain region of said enhancement mode transistor.

4. The process defined by claim 3 wherein said p-type threshold adjusting dopant comprises boron.

5. The process defined by claim 4 wherein said first and second source regions and said first drain region comprise arsenic doped regions.

6. The process defined by claim 4 wherein said first region comprises an arsenic doped region.

7. The process defind by claim 4 wherein said second region comprises a phosphorus doped region.

8. The process defined by claim 3 wherein the polycrystalline silicon of said first and second polycrystalline silicon gates is doped simultaneously with the doping of said second region.

9. The process defined by claim 8 wherein said simultaneously doping of said polycrystalline silicon and said second regions includes a phosphorus predeposition set.

* * * * *

UNITED STATES PATENT OFFICE
CERTIFICATE OF CORRECTION

Patent No. 4,033,026   Dated July 5, 1977

Inventor(s) Richard D. Pashley

It is certified that error appears in the above-identified patent and that said Letters Patent are hereby corrected as shown below:

Column 1, line 62, after "illustrates" should read --- the substrate ---.

Signed and Sealed this

Twenty-second Day of November 1977

[SEAL]

Attest:

RUTH C. MASON
Attesting Officer

LUTRELLE F. PARKER
Acting Commissioner of Patents and Trademarks